United States Patent [19]

Bouland et al.

[11] Patent Number: 4,549,143
[45] Date of Patent: Oct. 22, 1985

[54] F.M. DEMODULATOR WITH WAVEFORM CORRECTION CIRCUIT

[75] Inventors: Maurice Bouland, Rueil Malmaison, France; Wilhelmus A. J. Van Gurp; Wilhelmus A. J. M. Zwijsen, both of Eindhoven, Netherlands

[73] Assignee: U.S. Philips Corporation, New York, N.Y.

[21] Appl. No.: 628,179

[22] Filed: Jul. 6, 1984

[30] Foreign Application Priority Data

Jul. 7, 1983 [NL] Netherlands .................. 8302423

[51] Int. Cl.⁴ ............................................. H03D 3/00
[52] U.S. Cl. ................................. 329/126; 329/112; 329/131; 329/137; 329/145; 358/23
[58] Field of Search ........ 329/110, 112, 126, 137–143, 329/104, 107, 117, 118, 128, 131, 134, 145; 455/214, 337; 358/23, 24, 40

[56] References Cited

U.S. PATENT DOCUMENTS 3,701,030  10/1972  Gocho et al. ................ 329/112 X
3,863,161  1/1975   Johnson et al ............... 329/110 X Primary Examiner—Siegfried H. Grimm
Attorney, Agent, or Firm—Thomas A. Briody; William J. Streeter; Edward W. Goodman

[57] ABSTRACT

An F.M. demodulation circuit can be rendered insensitive to amplitude, level and waveform variations of the frequency-modulated carrier signal by using a frequency-demodulator (33,37) tuned to half the frequency of the carrier and preceded by a divide-by-two divider (21).

1 Claim, 1 Drawing Figure

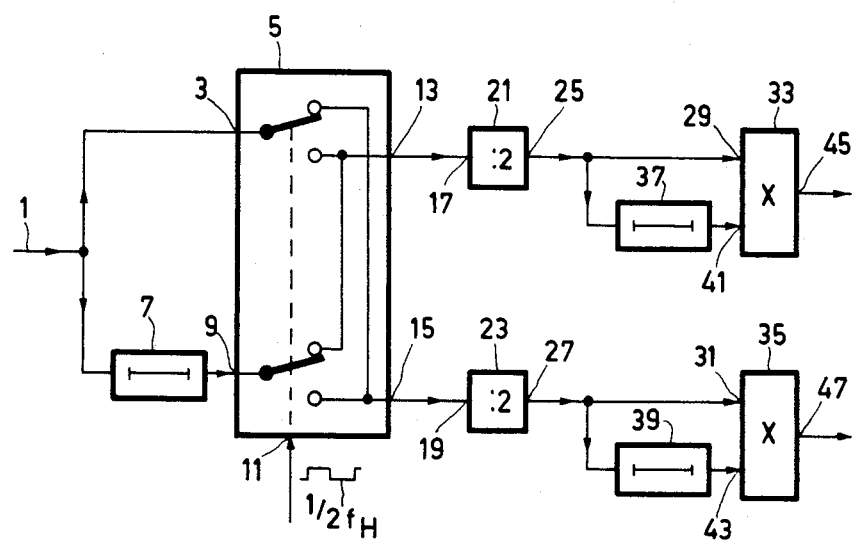

F.M. DEMODULATOR WITH WAVEFORM CORRECTION CIRCUIT

BACKGROUND OF THE INVENTION

The invention relates to an F.M. demodulation circuit comprising an F.M. demodulator preceded by a waveform correction circuit, for demodulating a carrier whose frequency is modulated by a modulating signal.

The European Patent Application No. 0003393 discloses a demodulation circuit of the above-described type, constructed as a SECAM demodulation circuit in which the waveform correction circuit is a limiter circuit with positive feedback to render the demodulation circuit less sensitive to levels, amplitude and waveform variations of the signal to be demodulated.

SUMMARY OF THE INVENTION

The invention has for its object to improve still further the insensitivity of the demodulation circuit to such variations.

According to the invention, an F.M. demodulator with waveform correction circuit of the type set forth in the opening paragraph, is characterized in that the waveform correction circuit is a divide-by-two divider and the demodulator is tuned to half the frequency of the carrier.

Because of the use of a divide-by-two divider, only the zero-crossings of the positive, or only the zero-crossings of the negative, edges of the signal to be demodulated are utilized. The mutual positions of these zero crossings are independent of the waveform, the amplitude or the level of the signal to be demodulated.

DESCRIPTION OF THE DRAWING

The invention will now be described in greater detail by way of example with reference to the drawing which contains only one FIGURE showing a block diagram of an F.M. demodulation circuit according to the invention, in the form of a SECAM demodulation circuit.

DESCRIPTION OF THE PREFERRED EMBODIMENT

A SECAM chrominance signal to be demodulated is applied to an input 1. As is known, this SECAM chrominance signal is a chrominance subcarrier signal whose frequency is modulated alternately by a first color-difference signal in one line period and by a second color-difference signal in a subsequent line period, and whose central frequency moreover changes its value from line period to line period.

This chrominance signal is applied to an input 3 of a change-over device 5 and, via a delay line 7 producing a delay of one line period, to an input 9 of the change-over device 5.

The change-over device 5 is controlled by a signal of half the line frequency ½ $f_H$, applied to a control signal input 11 of this device. In response to this signal, the first color difference signal, for example, becomes available at an output 13 of the change-over device 5 and the second color-difference signal at an output 15. Each of these signals is alternately available without a delay and delayed by the delay line 7.

The first and second color-difference signals, are respectively applied from the outputs 13 and 15 of the change-over device 5 to respective inputs 17 and 19 of respective divice-by-two dividers 21 and 23.

These divide-by-two dividers 21 and 23 are bistable circuits which change state in response to, for example, each zero-crossing of a predetermined, for example positive, edge of the input signal. The spacing between these zero-crossings does not depend on the weaveform, the level or the amplitude of the signal at the inputs 17 and 19, respectively, of the respective divide-by-two dividers 21 and 23. As a result thereof, there occurs at outputs 25 and 27, respectively, of the divide-by-two dividers 21 and 23, respectively, frequency-modulated signals of half the chrominance subcarrier frequency having waveforms which are independent of the amplitude and the waveform of the input signal.

These frequency-modulated signals of half the chrominance subcarrier frequency are applied to first inputs 29 and 31, respectively, of respective multiplying or gate circuits 33 and 35 and via delay lines 37 and 39, respectively producing a delay of one quarter of the period of a signal of half the central frequency of the relevant color-difference signal, to second inputs 41 and 43, respectively, of the respective multiplying or gate circuits 33 and 35. Then the demodulated first and second color-difference signals, respectively, occur at the respective outputs 45 and 47 of the respective multiplying or gate circuits 33 and 35.

Instead of using the delay lines 37 and 39, respectively, it is alternatively possible to use a network having a tuned parallel circuit which is fed via a series capacitance and produces, for half the central frequency of the relevant color-difference signal, a 90° phase shift of the signal at the inputs 41 and 43, respectively, relative to the signal at the inputs 29 and 31, respectively, of the multiplying or gate circuits 33 and 35, respectively.

The circuit serving as a frequency demodulator and comprising the respective delay lines 37 and 39 and the respective multiplying or gate circuits 33 and 35, may further, if so desired, be replaced by a different type of tuned frequency demodulator, such as, for example, a phase-locked loop-demodulator.

If so desired, it is alternatively possible to use a single demodulator when the demodulation circuit is, for example, used in a converter circuit for converting a SECAM chrominance signal into a sequential chrominance carrier signal which is amplitude line-sequentially modulated with suppressed carrier by the first and second color-difference signals, respectively, and which can be processed by a PAL demodulation circuit.

In the above-described embodiment, the modulating signal is a color-difference signal and the carrier is a chrominance subcarrier. It will be obvious that the use of a divide-by-two divider and an F.M. demodulator tuned to half the carrier frequency is alternatively suitable for use in an F.M. demodulation circuit in which the modulating signal is, for example, an audio signal modulating the frequency of a carrier.

What is claimed is:

1. F.M. demodulator with waveform circuit comprising a tuned F.M. demodulator preceded by a waveform correction circuit for demodulating a carrier whose frequency is modulated by a modulating signal, chacterized in that the waveform correction circuit is a divide-by-two divider and the demodulator is tuned to half the frequency of the carrier.

* * * * *